(12) United States Patent  (10) Patent No.: US 8,829,971 B2
Yamazaki  (45) Date of Patent: Sep. 9, 2014

(54) LEVEL SHIFTER CIRCUIT, INTEGRATED CIRCUIT DEVICE, ELECTRONIC WATCH

(71) Applicant: Seiko Epson Corporation, Tokyo (JP)

(72) Inventor: Yutaka Yamazaki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/676,617

(22) Filed: Nov. 14, 2012

(65) Prior Publication Data

US 2013/0135027 A1   May 30, 2013

(30) Foreign Application Priority Data

Nov. 29, 2011 (JP) ................. 2011-260253

(51) Int. Cl.
*H03L 5/00* (2006.01)
*H03K 19/0185* (2006.01)

(52) U.S. Cl.
CPC .............................. *H03K 19/018521* (2013.01)
USPC ........................................................ 327/333

(58) Field of Classification Search
USPC ............. 327/333; 326/68, 80, 81; 365/189.11
See application file for complete search history.

(56) References Cited

U.S. PATENT DOCUMENTS

| 4,045,691 | A  * | 8/1977 | Asano ............................. 326/68 |
| 6,791,392 | B2 * | 9/2004 | Maejima et al. .............. 327/333 |
| 7,397,297 | B2 | 7/2008 | Kimura |
| 2009/0002027 | A1 * | 1/2009 | Lee ................................. 326/80 |

FOREIGN PATENT DOCUMENTS

| JP | 2007-208714 A | 8/2007 |
| JP | 2009-171084 A | 7/2009 |

* cited by examiner

*Primary Examiner* — Sibin Chen
(74) *Attorney, Agent, or Firm* — Global IP Counselors, LLP

(57) ABSTRACT

A first circuit receives input signals of the first electric potential system which uses a first high potential and a first low potential as the power supply electric potential, and outputs a first signal which is a signal of the first electric potential system, a second circuit which generates output signals according to the input signal of the second electric potential system which uses as the power supply electric potential a second high potential of the first electric potential system, wherein the second circuit includes an initial stage inverter that receives the second signals and outputs third signals, and an initial stage switch that switches between connecting and disconnecting the initial stage inverter and a power supply that supplies the second high potential or a power supply that supplies the second low potential based on the first signals, and generates the output signals based on the third signals.

9 Claims, 16 Drawing Sheets

LEVEL SHIFTER CIRCUIT, INTEGRATED CIRCUIT DEVICE, ELECTRONIC WATCH

CROSS-REFERENCE TO RELATED APPLICATIONS

This application claims priority to Japanese Patent Application No. 2011-260253 filed on Nov. 29, 2011. The entire disclosure of Japanese Patent Application No. 2011-260253 is hereby incorporated herein by reference.

BACKGROUND

1. Technical Field

The present invention relates to a level shifter circuit, an integrated circuit device, and an electronic watch.

2. Background Technology

As semiconductor processes have evolved, it has become necessary to exchange data by connecting circuits that operate at different power supply voltages. At this time, a level shifter circuit for adjusting voltage levels is used to transmit the correct logic level.

For example, with a bulk type MOS integrated circuit, an active region is formed on a substrate or well region to constitute a MOS transistor. Meanwhile, with an SOI (Silicon-on-Insulator) type MOS integrated circuit, without using a well region, a large number of active regions are formed on an insulating thin film on a substrate to constitute MOS transistors on individual active regions.

Therefore, the SOI type MOS integrated circuit is fundamentally different from the bulk type MOS integrated circuit in terms of the element separation, and there is almost no junction capacitance or junction leakage with the substrate. With the SOI type, compared to the bulk type, lower voltage operation, lower power consumption, and higher speed operation are possible. For that reason, when signals are received from an SOI type integrated circuit device, the bulk type integrated circuit device adjusts the voltage level with a level shifter circuit. For example, the level shifter circuit of Patent Document 1 is used with the input terminal, and adjusts the level of the input voltage thereof.

Japanese Laid-open Patent Publication No. 2007-208714 (Patent Document 1) is an example of the related art.

SUMMARY

Problem to be Solved by the Invention

However, it is possible for a large parasitic capacitance to occur between the level shifter circuit input terminal and power supply terminal. At this time, it is possible that a charge accumulated in this parasitic capacitance will be discharged along with changes in signals of a different electric potential system from the input signal electric potential system. That being the case, there can be high frequency spike noise (impulse noise) riding on the output signals of the level shifter circuit, or the response speed until generation of a stable output signal after receiving the input signal can be slow.

The invention was created to address these kinds of problems. With a number of modes of the invention, it is possible to provide a level shifter circuit for preventing spike noise from riding on the output signals, and the response speed from becoming slower.

Means for Solving Problem (1) According to the invention, a level shifter circuit is for transmitting signals of a first electric potential system to a second electric potential system for which the power supply potential difference is larger than that of the first electric potential system, including a first circuit for receiving input signals of the first electric potential system which uses as the power supply electric potential a first high potential which is on the high potential side and a first low potential which is on the low potential side, and outputs a first signal which is a signal of the first electric potential system, a second circuit which generates output signals according to the input signals of the second electric potential system which uses as the power supply electric potential a second high potential which is on the high potential side and a second low potential which is on the low potential side, and a buffer circuit which receives the input signals and generates logically equivalent second signals to the input signals which are signals of the first electric potential system, wherein the second circuit includes an initial stage inverter which is an inverter circuit that receives the second signals and outputs third signals, and an initial stage switch that switches between connecting and disconnecting the initial stage inverter and a power supply that supplies the second high potential or a power supply that supplies the second low potential based on the first signals, and generates the output signals based on the third signals.

(2) With this level shifter circuit, the second circuit can also use signals for which the third signals have been inverted as the output signals.

The level shifter circuit of these inventions transmits signals of a first electric potential system to a second electric potential system for which the difference in power supply potential is greater than that of the first electric potential system. The level shifter circuit includes a first circuit which receives input signals of a first electric potential system and outputs first signals which are signals of a first electric potential system, and a second circuit which generates output signals according to the input signals of a second electric potential system.

The level shifter circuit of these inventions includes a buffer circuit that receives input signals, and generates second signals that are signals of a first potential electric system and are logically equivalent to the input signals. Then, the initial stage inverter of the second circuit receives second signals rather than the input signals. For that reason, it is possible to prevent the charge charged to the parasitic capacitance of the first circuit from flowing to the power supply to which the initial stage inverter is connected via the initial stage switch (power supply that supplies a second high potential or power supply that supplies a second low potential). As a result, it is possible to provide a level shifter circuit that prevents spike noise from riding on the output signals, and the response speed from slowing down.

Here, the second circuit can also use signals for which the third signals are inverted as output signals. In other words, it is also possible to have the third signals be second electric potential system signals for which the input signals have been logically inverted, and to invert those to generate output signals. At this time, it is possible to simplify the circuit configuration, and also possible to make the scale of the circuit small.

It is not necessary to use the third signals directly to generate output signals. For example, it is also possible to use the third signals as output signals or as a switch for generating the original signals thereof. It is also possible, for example, to generate output signals based not only on third signals but also first signals.

(3) With this level shifter circuit, it is also possible to use the same electric potential for the first high potential and the second high potential.

(4) With this level shifter circuit, the second circuit can have the initial stage inverter disconnected from the power supply that supplies the second low potential using the initial stage switch when the input signal is low level, and can have the initial stage inverter connected to the power supply that supplies the second low potential by the initial stage switch when the input signal is high level.

(5) With this level shifter circuit, it is possible to use the same electric potential for the first low potential and the second low potential.

(6) With this level shifter circuit, the second circuit can have the initial stage inverter disconnected from the power supply that supplies the second high potential using the initial stage switch when the input signal is high level, and can have the initial stage inverter connected to the power supply that supplies the second high potential using the initial stage switch when the input signal is low level.

With these inventions, using the first electric potential system and the second electric potential system, it is possible to reduce the number of power supplies and thus make the circuit scale smaller by using the low potential and the high potential in common. Here, there are two power supply electric potentials, the reference potential and the drive potential, with one electric potential system, but it is preferable to use a common reference potential for both. For example, when using an N type substrate, the high potential side is the reference potential. Conversely, when using a P type substrate, the low potential side is the reference potential. In other words, when using the N type substrate, the level shifter circuit can use the same electric potential for the first high potential and the second high potential. Also, when using the P type substrate, the level shifter circuit can use the same electric potential for the first low potential and the second low potential.

Here, the second circuit of the N type substrate can have the initial stage inverter disconnected from the power supply that supplies the second low potential when the input signals are low level, and have the initial stage inverter connected to the power supply that supplies the second low potential when the input signals are high level. This disconnection and connection can be executed using the initial stage switch.

Also, the second circuit of the P type substrate can have the initial stage inverter disconnected from the power supply that supplies the second high potential when the input signals are high level, and have the initial stage inverter connected to the power supply that supplies the second high potential when the input signals are low level.

(7) With this level shifter circuit, the buffer circuit can also be constituted with an even number stage inverter.

With the invention, the buffer circuit is constituted with an even number stage inverter. For that reason, the circuit configuration is simple, and it is possible to adjust the circuit scale and signal delay by changing the number of stages.

(8) The invention can also be an integrated circuit device containing the aforementioned level shifter circuit.

With the invention, when the integrated circuit device containing this level shifter circuit is connected with, for example, another integrated circuit device, a tester, or the like, it is possible to quickly transmit signals without any spike noise even between different electric potential systems. This level shifter circuit can also be used particularly as an input buffer or output buffer with an integrated circuit device.

(9) The invention can also be an electronic watch containing the aforementioned integrated circuit device.

The electronic watch of the invention contains an integrated circuit device equipped with a level shifter circuit for which it is possible to connect circuits using different electric potential systems and to transmit the correct signals. For that reason, for example, it is possible to do testing of an electronic watch for which the power consumption is suppressed by including a circuit that operates at a low power supply voltage such as an SOI type MOS integrated circuit using a well-known bulk type MOS integrated circuit tester. For that reason, it is possible to suppress power consumption and manufacturing costs of the electronic watch.

BRIEF DESCRIPTION OF THE DRAWINGS

Referring now to the attached drawings which form a part of this original disclosure.

DETAILED DESCRIPTION OF EXEMPLARY EMBODIMENTS

Figure 1:
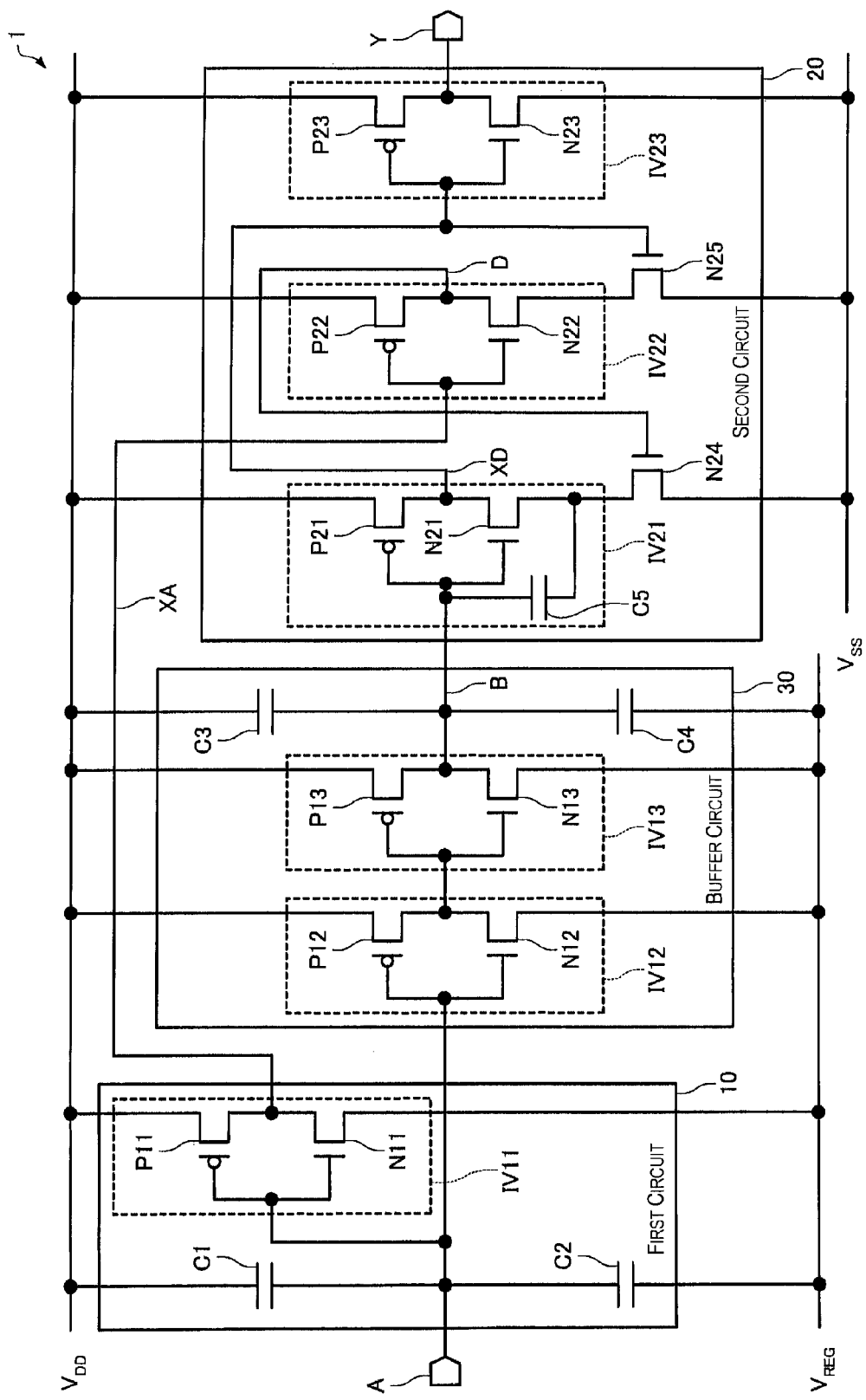
FIG. 1 is a circuit diagram of the level shifter circuit of the first embodiment.

Following, we will describe embodiments of the invention while referring to the drawings. First, we will describe a comparison example, after which we will describe the level shifter circuit of the first embodiment.

1. Comparison Example 1.1 Comparator Circuit Configuration

Figure 7:
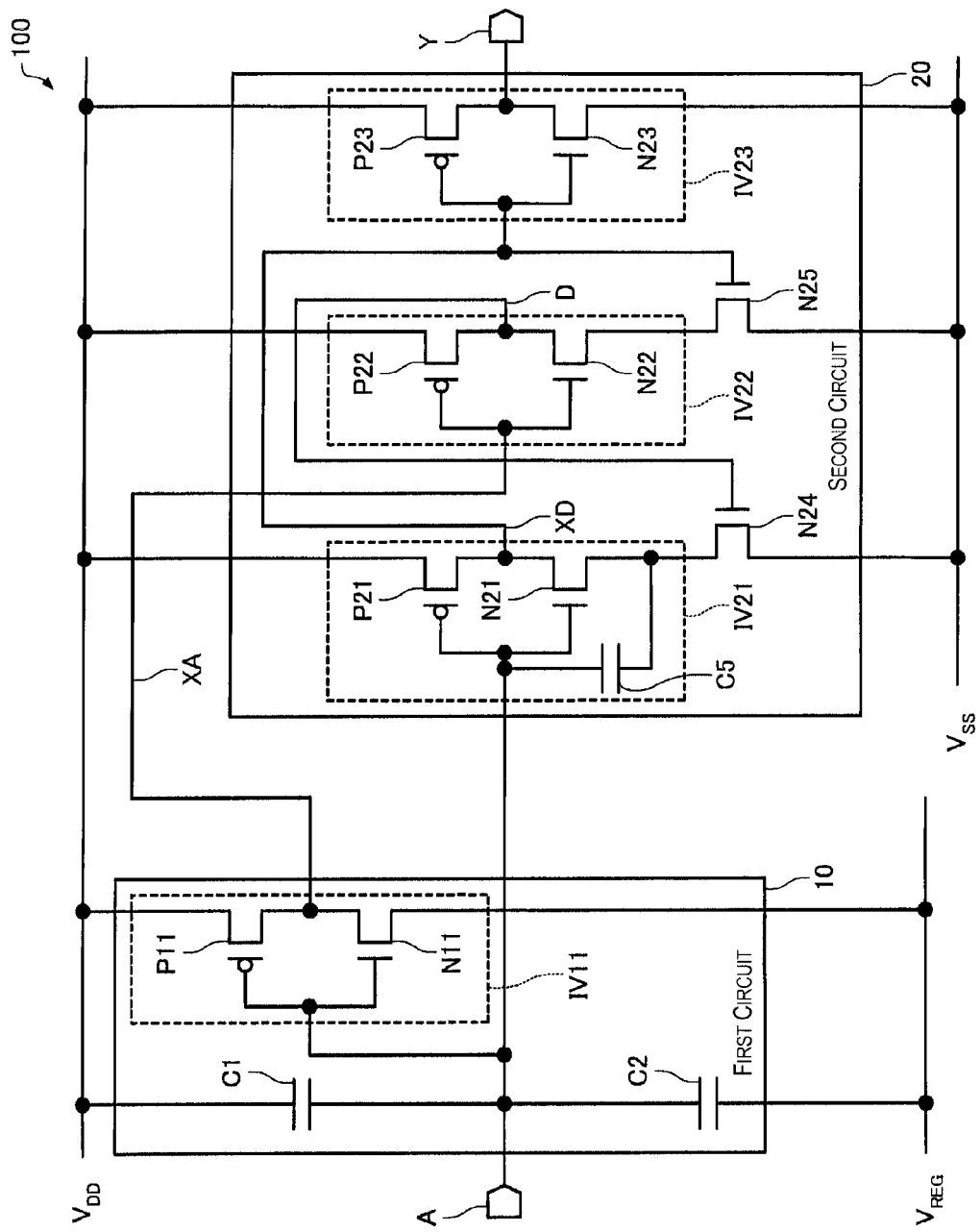
FIG. 7 is a circuit diagram of the comparison example.

We will describe the level shifter circuit that is a comparison example (hereafter referred to as the comparator circuit) while referring to FIG. 7. The comparator circuit 100 receives input signal A, generates output signal Y, and outputs that to a later stage circuit. The comparator circuit 100 includes a first circuit 10 which uses the first electric potential system and a second circuit 20 which uses the second electric potential system.

With the example of the comparator circuit 100 of FIG. 7, the first electric potential system uses the higher power supply potential (hereafter referred to as the first high potential) as $V_{DD}$, and uses the lower power supply potential (hereafter referred to as the first low potential) as $V_{REG}$. Also, the second electric potential system uses the higher power supply potential (hereafter referred to as the second high potential) as $V_{DD}$, and uses the lower power supply potential (hereafter referred to as the second low potential) as $V_{SS}$. At this time, using an N type substrate for this, the higher power supply potential which is the reference potential is common to both the first electric potential system and the second electric potential system (first high potential=second high potential=$V_{DD}$). Note that we are assuming that $V_{SS}<V_{REG}<V_{DD}$).

The first circuit 10 receives input signal A, and outputs first signal XA which is a first electric potential system signal. The first circuit 10 outputs the inverted signal of the input signal A as the first signal XA using the inverter IV11 consisting of a P type transistor P11 and an N type transistor N11. Here, at the first circuit 10, parasitic capacitance C1 and C2 exist between the signal line that transmits the input signal A and the power supply.

The second circuit 20 receives input signal A and first signal XA, and generates output signal Y which is a second electric potential system signal. The second circuit 20 contains three inverters. Specifically, it contains an inverter IV21 consisting of P type transistor P21 and N type transistor N21, an inverter IV22 consisting of P type transistor P22 and N type transistor N22, and an inverter IV23 consisting of P type transistor P23 and N type transistor N23. Here, the inverter IV21 is specifically called the initial stage inverter. The input signal A is input to the initial stage inverter (inverter IV21) of the comparator circuit 100, and the inverted signal thereof is inverted by the inverter IV23 to generate the output signal Y.

The initial stage inverter and the inverter IV22 are respectively connected to the power supply that supplies the second low potential (here, $V_{SS}$) via the N type transistor N24 and the N type transistor N25. Signals output from the inverter IV22 and the initial stage inverter are respectively connected to the gates of the N type transistor N24 and the N type transistor N25.

Here, the N type transistor N24 that switches connect/disconnect of the connection between the initial stage inverter and the power supply that supplies the second low potential is specifically called the initial stage switch. Then, as shown in FIG. 7, parasitic capacitance C5 exists between the signal line that transmits the input signal A and the node that connects the initial stage inverter and the initial stage switch.

1.2 Comparator Circuit Operation

Figure 8:
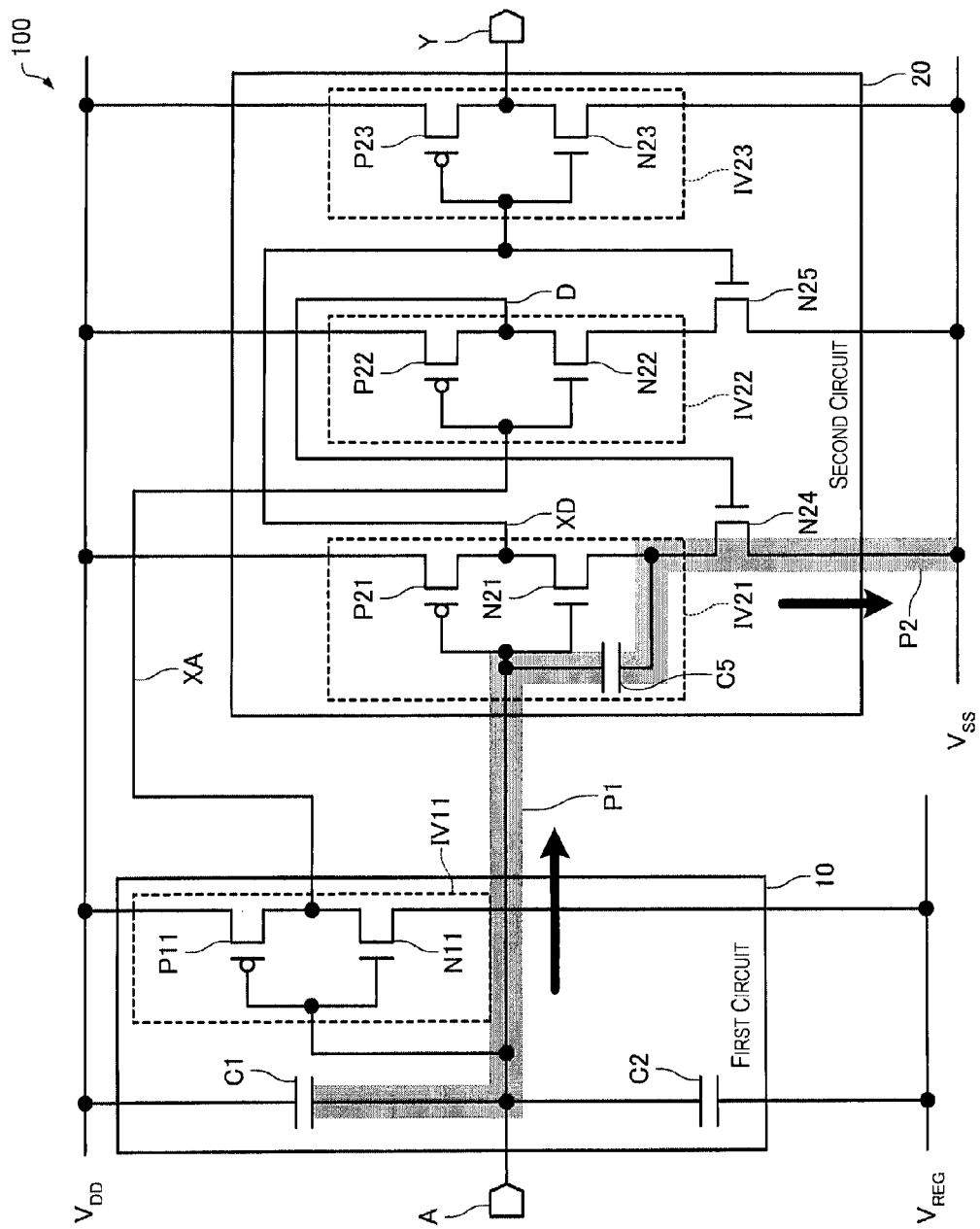
FIG. 8 is a circuit diagram for illustrating the discharge path of the comparison example.

FIG. 8 is a circuit diagram for illustrating the discharge path from the parasitic capacitance C1 at the comparator circuit 100. For items that are the same as those in FIG. 7, the same reference numbers are given, and an explanation thereof is omitted.

With the comparator circuit 100, the parasitic capacitance C1 and the parasitic capacitance C5 are directly connected by the signal line that transmits the input signal A (path P1 in FIG. 8). For that reason, the charge accumulated in the parasitic capacitance C1 flows toward the parasitic capacitance C5. Then, when the initial stage switch goes to an on state, the charge of the parasitic capacitance C5 flows to the power supply line (path P2 in FIG. 8).

At this time, the input signal A wavers due to the effect of discharge from the parasitic capacitance C1. As a result, there are problems such as that, with the comparator circuit 100, high frequency spike noise rides on the output signal Y, and the response speed from when the input signal A is received until a stable output signal Y is generated becomes slow.

Following, we will describe the operation of the comparator circuit 100 with this problem as the background.

With advances in semiconductor process methods and miniaturization in recent years, there has been demand for greater voltage conversion capability for level shifter circuits. For example, this can be used not only when connecting between bulk type MOS integrated circuits manufactured with different generation semiconductor processes, but also when connecting between an SOI type MOS integrated circuit which operates at a much lower power supply voltage than the bulk type, and a bulk type MOS integrated circuit. In such a case, a level shifter circuit with greater voltage conversion capability is necessary.

Figure 9A:
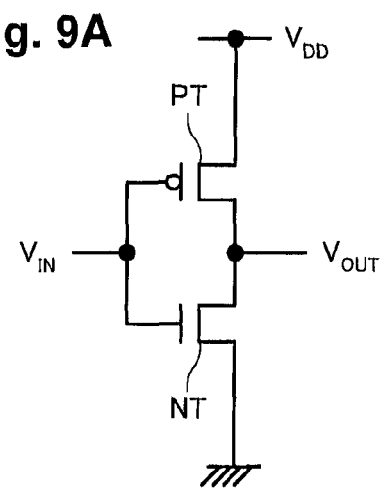
FIG. 9 A to FIG. 9 C are diagrams for explaining the basic configuration of a transistor.
Figure 9B:
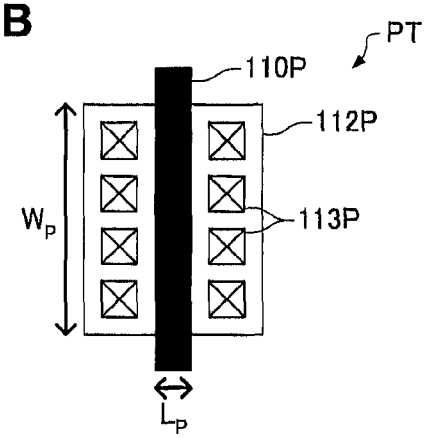
Figure 9C:
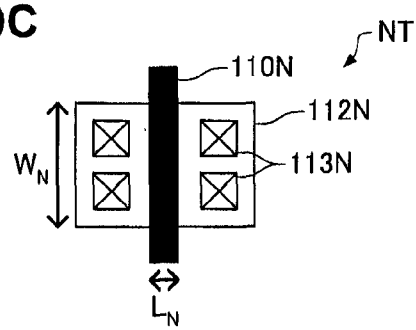

FIG. 9 A shows a circuit diagram of an inverter consisting of a P type transistor PT and an N type transistor NT. The inverter in FIG. 9 A performs voltage conversion, and can be thought of as correlating to the initial stage inverter (inverter IV21) or inverter IV22 in FIG. 7 and FIG. 8. For example, the input signal $V_{IN}$ of the inverter in FIG. 9 A corresponds to the input signal A of the first electric potential system in FIG. 7. Also, the output signal $V_{OUT}$ corresponds to the inverted signal (XD) which is the signal of the second electric potential system in FIG. 7. However, for the purposes of this explanation, the inverter circuit of FIG. 9 A shall be constituted on a P type substrate, and the second electric potential system shall use as the power supply potential ground potential (corresponds to $V_{SS}$ in FIG. 7) and $V_{DD}$ which is a positive potential.

FIG. 9 B is a plan view illustrating an example of the layout of the P type transistor PT. Here, 110P is a gate region, and 112P is a P diffusion region, with these constituting source and drain regions. 113P represents a contact. At this time, the P type transistor PT gate length is $L_P$, and the gate width is $W_P$.

Also, FIG. 9 C is a plan view illustrating an example of the layout of the N type transistor NT. Here, 110N is a gate region, and 112N is an N diffusion region, with these constituting source and drain regions. 113N represents a contact. At this time, the N type transistor NT gate length is $L_N$, and the gate width is $W_N$.

Here, the per unit area capacitance of the gate oxidation film is $C_{OX}$, and the positive hole mobility is $\mu_P$. Then, the P type transistor PT gain coefficient $\beta_P$ is as shown in the formula (1) noted below.

[Formula 1]

$$\beta_P = \frac{W_P}{L_P} \mu_P C_{OX} \qquad (1)$$

Also, the electron mobility is $\mu_N$. Then, the N type transistor NT gain coefficient $\beta_N$ is as shown in the formula (2) noted below.

[Formula 2]

$$\beta_N = \frac{W_N}{L_N} \mu_N C_{OX} \qquad (2)$$

Figure 10:
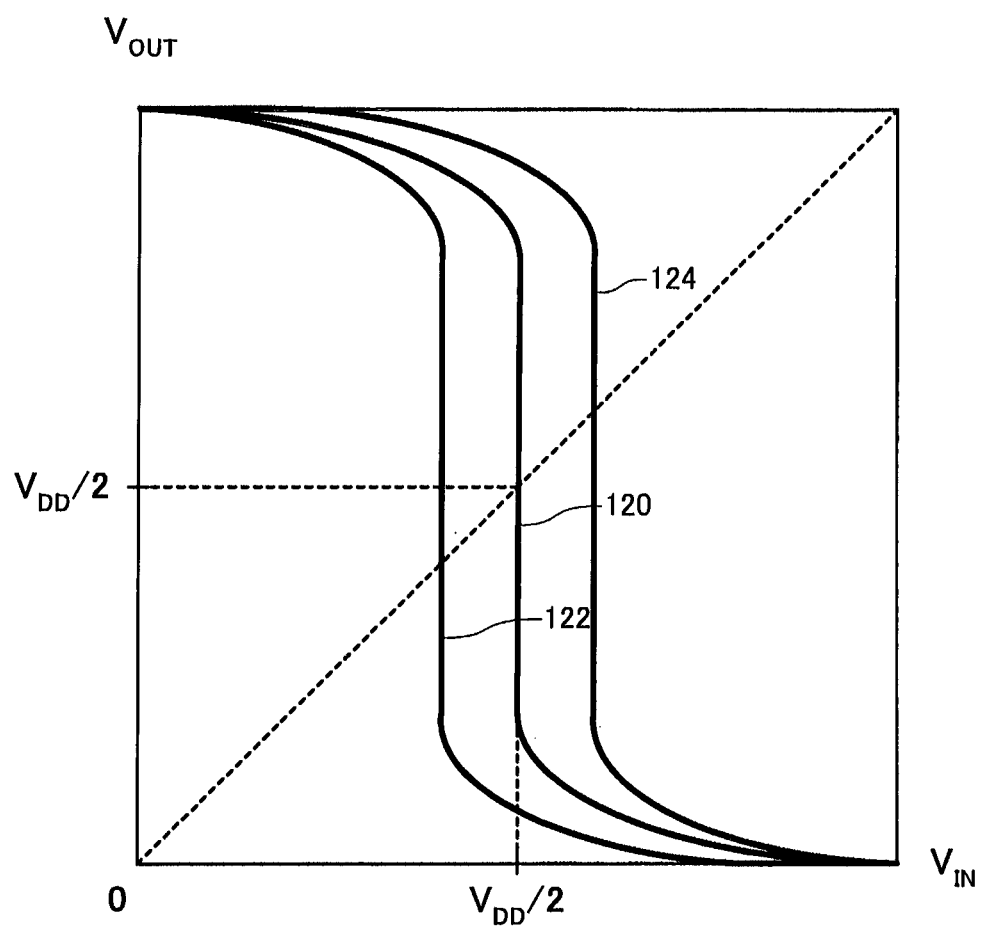
FIG. 10 is a diagram for explaining the input/output characteristics of the inverter.
Figure 11A:
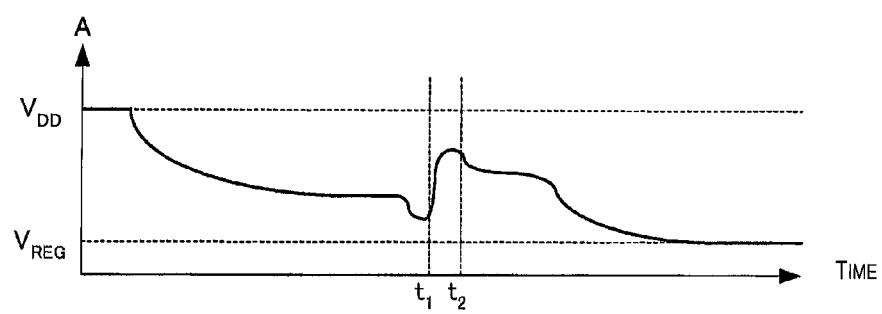
FIG. 11A to FIG. 11E are waveform diagrams for explaining the comparison example level shifter noise and response speed slowness.
Figure 11B:
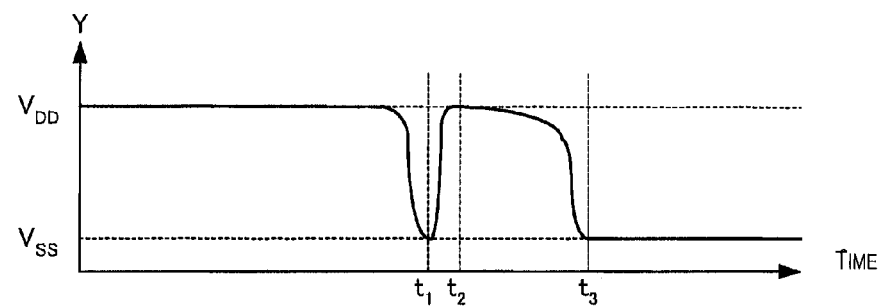
Figure 11C:
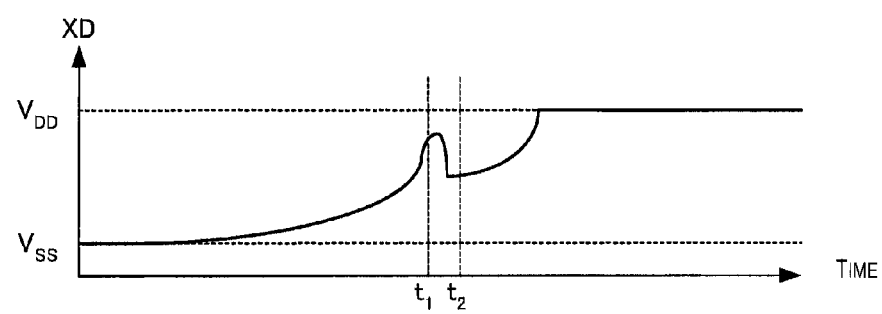
Figure 11D:
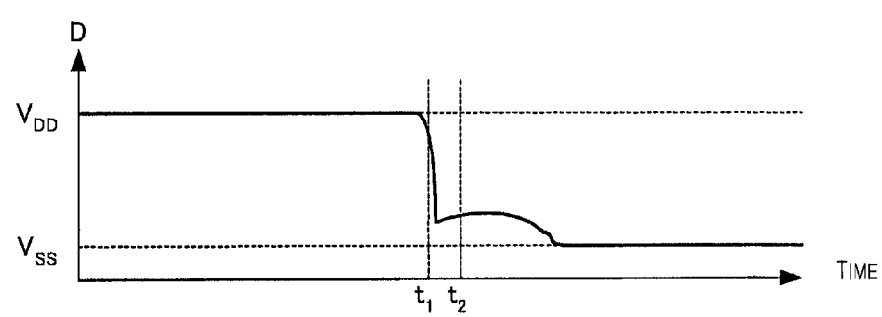
Figure 11E:
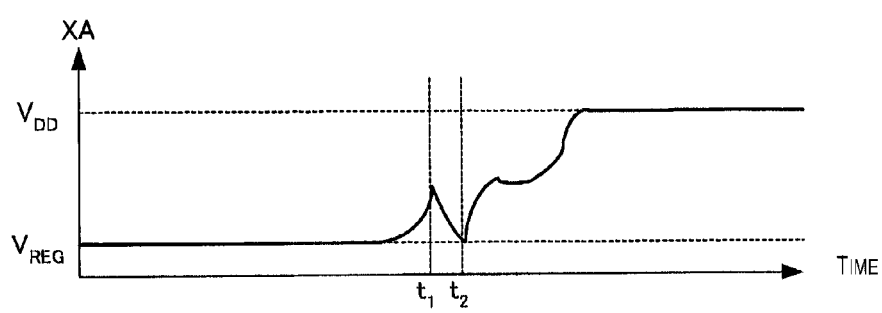

FIG. 10 is a diagram for explaining the input/output characteristics of the inverter. When the gain coefficient $\beta_N$ and the gain coefficient $\beta_P$ are equal ($\beta_N/\beta_P=1$), as shown by the characteristic curve 120, this becomes an ideal inverter for which the inverter threshold value is $V_{DD}/2$.

Here, to constitute the level shifter circuit, it is necessary to shift the inverter threshold value from $V_{DD}/2$. At this time, by adjusting the gate length and the gate width, and adjusting the ratio of the gain coefficient $\beta_N$ and the gain coefficient $\beta_P$, it is possible to obtain the desired inverter threshold value.

For example, when $\beta_N/\beta_P > 1$, as shown by the characteristic curve 122, the inverter threshold value is smaller than $V_{DD}/2$. When $\beta_N/\beta_P < 1$, as shown by the characteristic curve 124, the inverter threshold value is greater than $V_{DD}/2$.

With the comparator circuit 100 in FIG. 7, the circuit is constituted on an N type substrate and $V_{DD}$ is used as the reference potential, so it is necessary that $\beta_N/\beta_P < 1$.
From formula (1) and formula (2), using gate length and gate width, $\beta_N/\beta_P$ is as shown by formula (3) noted below.

[Formula 3]

$$\frac{\beta_N}{\beta_P} = \frac{\mu_N}{\mu_P} \times \frac{W_N L_P}{W_P L_N} \quad (3)$$

According to formula (3), for example by making $L_N$ which is the gate length of the N type transistor (in FIG. 7, corresponding to N type transistors N21 and N22) greater, it is possible to adjust $\beta_N/\beta_P$ to a value less than one, and to obtain the desired inverter threshold value.

Here, with advances in semiconductor processes in recent years, it is possible to obtain a greater voltage conversion capacity with level shifter circuits. Having done that, it is necessary to make the gate length ($L_N$) of the N type transistor even larger, but as a result, the parasitic capacitance (corresponding to parasitic capacitance C5 in FIG. 7) also becomes greater. For that reason, by charging and discharging with a large parasitic capacitance, with the example of the comparator circuit 100 in FIG. 7, problems occur such as spike noise riding on the output signal Y, and the response speed of the output signal Y becoming slower.

Using formula (3), for example even if $W_N$ which is the gate width of the N type transistor is made larger, it is possible to adjust $\beta_N/\beta_P$ to a desired value of less than 1. However, when the gate width ($W_N$) of the N type transistor is made larger, current flows more easily and the power consumption becomes greater, so in actuality this kind of adjustment is difficult. Thus, hereafter, we will explain large voltage conversion capability of the level shifter circuit as something that can be realized by increasing the gate length ($L_N$) of the N type transistor.

Here, again referring to FIG. 8, we will explain the phenomena of spike noise riding on the output signal Y and slower response speed with changes in signals with the comparator circuit 100. The initial stage inverter (inverter IV21) and inverter IV22 are adjusted so that $\beta_N/\beta_P < 1$.

We will explain a case of the input signal A changing from high level to low level. At this time, along with changes in the input signal A of the first electric potential system, a change of the output signal Y which is a second electric potential system signal can be expected to change from high level to low level.

With the comparator circuit 100, when the input signal A changes from high level to low level (ST1), the first signal XA which is the output of the inverter IV11 which operates with the first electric potential signal changes to high level (ST2). Also, when the P type transistor P21 is turned on, the output signal (XD) of the initial stage inverter changes to high level (ST3).

Having done that, the output signal Y of the inverter IV23 goes to low level (ST4). Also, when the N type transistor N25 is turned on, its drain terminal potential is determined. Then, when the N type transistor N22 is turned on with the inverter IV22, the P type transistor P22 is turned off. As a result, the output signal (D) of the inverter IV22 goes to low level (ST5).

Then, when the initial stage switch (N type transistor N24) is turned off, its drain terminal potential is determined. At this time, the charge charged in the parasitic capacitance C1 flows to the parasitic capacitance C5 through the path P1. Having done that, with a large parasitic capacitance C5, a phenomenon occurs whereby the input signal A is pulled back to high level (ST6).

Along with this change in the input signal A, the first signal XA which is the output of the inverter IV11 is pulled back to low level (ST7). Also, when the P type transistor P21 is turned on, the output signal (XD) of the initial stage inverter is pulled back to low level (ST8). At this time, the output signal Y is pulled back to high level (ST9), so spike noise rides on the output signal Y.

Then, along with changes in the first signal XA, the N type transistor N22 of the inverter IV22 turns off, and the P type transistor P22 is turned on. As a result, the output signal (D) of the inverter IV22 is pulled back to high level (ST10), and the initial stage switch is turned on.

Having done this, the charge charged to the parasitic capacitance C5 flows to the power supply which supplies the second low potential (here this is $V_{SS}$). At this time, the parasitic capacitance C5 is connected to the signal line that transmits the input signal A, so the input signal A potential is not determined during discharge of the parasitic capacitance C5. For that reason, the response speed of the output signal Y becomes slower (ST11).

FIG. 11A to FIG. 11E are examples of waveform diagrams illustrating the problems of this kind of comparator circuit 100. To avoid redundant explanations, we will give a brief explanation using codes ST1 to ST11 given to the description regarding changes in the aforementioned signals in regards to each waveform state.

FIG. 11 A is a waveform diagram of a case when the input signal A at the comparator circuit 100 changes from high level to low level. Then, FIG. 11 B to FIG. 11 E respectively represent changes corresponding to the FIG. 8 comparator circuit 100 output signal Y, the initial stage inverter output signal (XD), the inverter IV22 output signal (D), and the first signal XA.

At time t1 in FIG. 11 A, the input signal A changes from high level to low level (ST1). Then, as shown in FIG. 11 E, the first signal XA of the first electric potential system changes to high level at time t1 (ST2). At this time, the output signal (XD) of the initial stage inverter changes to high level as shown in FIG. 11 C (ST3).

Also, at time t1, the output signal Y goes to low level once as shown in FIG. 11 B (ST4), and the output signal (D) of the inverter IV22 changes to low level as shown in FIG. 11 (D) (ST5).

However, with this, the initial stage switch is turned off, and the potential of the node (N type transistor N24 drain terminal) connected to the initial stage inverter is determined. At this time, the charge charged to the parasitic capacitance C1 of FIG. 8 flows to the parasitic capacitance C5 through the path P1. Having done that, a phenomenon such as the input signal A being pulled back to high level occurs as shown at time t2 in FIG. 11 A (ST6).

For that reason, as shown in FIG. 11 E, the first signal XA is pulled back to low level at time t2 (ST7). At this time, the output signal (XD) of the initial stage inverter is pulled back to low level as shown in FIG. 11 C (ST8), and the output signal Y is pulled back to high level as shown in FIG. 11 B (ST9). Thus, as shown in FIG. 11 B, spike noise rides on the output signal Y.

Along with changes in the first signal XA, the P type transistor P22 turns on. As a result, as shown at time t2 in FIG. 11 D, the output signal (D) of the inverter IV22 is pulled back to high level (ST10), and the initial stage switch is turned on. When the initial stage switch is turned on, discharge of the parasitic capacitance C5 starts, and the electric potential of the input signal A is not determined. For that reason, the output signal Y is not determined by time t3 in FIG. 11 B, and the response speed becomes slower (ST11).

In this way, with the comparator circuit 100, problems occur of high frequency spike noise riding on the output signal Y, and the response speed becoming slower until a stable output signal Y is generated after receiving the input signal A.

2. First Embodiment 2.1. Configuration of the Level Shifter of this Embodiment

FIG. 1 is a circuit diagram of the level shifter circuit 1 of this embodiment. The level shifter circuit 1 of this embodiment resolves the comparison example problems of the occurrence of spike noise and delay in the response speed.

The level shifter circuit 1 can be used for various devices or the like, but with this embodiment, the level shifter 1 is used for input/output of signals from the outside or signals to the outside with a semiconductor integrated circuit. The same code numbers are given to the same elements in FIG. 7 to FIG. 11 E, and an explanation of already explained elements will be omitted.

The same as with the comparator circuit 100 of FIG. 7, the level shifter circuit 1 of this embodiment transmits first electric potential system signals to the second electric potential system which has a greater power supply potential difference than that of the first electric potential system. Here, as is clear when compared with the comparator circuit 100 of FIG. 7, the level shifter circuit 1 of this embodiment includes a buffer circuit 30 between a first circuit 10 that uses the first electric potential system and a second circuit 20 that uses the second electric potential system.

The buffer circuit 30 is constituted with a two stage inverter which operates with the first electric potential system. In other words, with the example of FIG. 1, this includes an inverter IV12 consisting of a P type transistor P12 and an N type transistor N12, and an inverter IV13 consisting of a P type transistor P13 and an N type transistor N13.

The inverter IV12 receives the input signal A. Then, the inverter IV13 receives that inverted output signal, and outputs that as the second signal B which is the first electric potential system to the initial stage inverter (inverter IV21) of the second circuit. The second signal B is a logically equivalent value to the input signal A. With this embodiment, this is constituted with a two stage inverter, but it is also possible to constitute this with a different even number of stages (four stages, for example).

Here, with the buffer circuit 30, there are parasitic capacitances C3 and C4 between the signal line for transmitting the second signal B and the power supply. The configuration of the second circuit 20 is the same as that of the comparator circuit 100 except for the initial stage inverter (inverter IV21) receiving the second signal B rather than the input signal A. The output signal of the input stage inverter is called the third signal XD.

2.2. Buffer Circuit Effect

Figure 2:
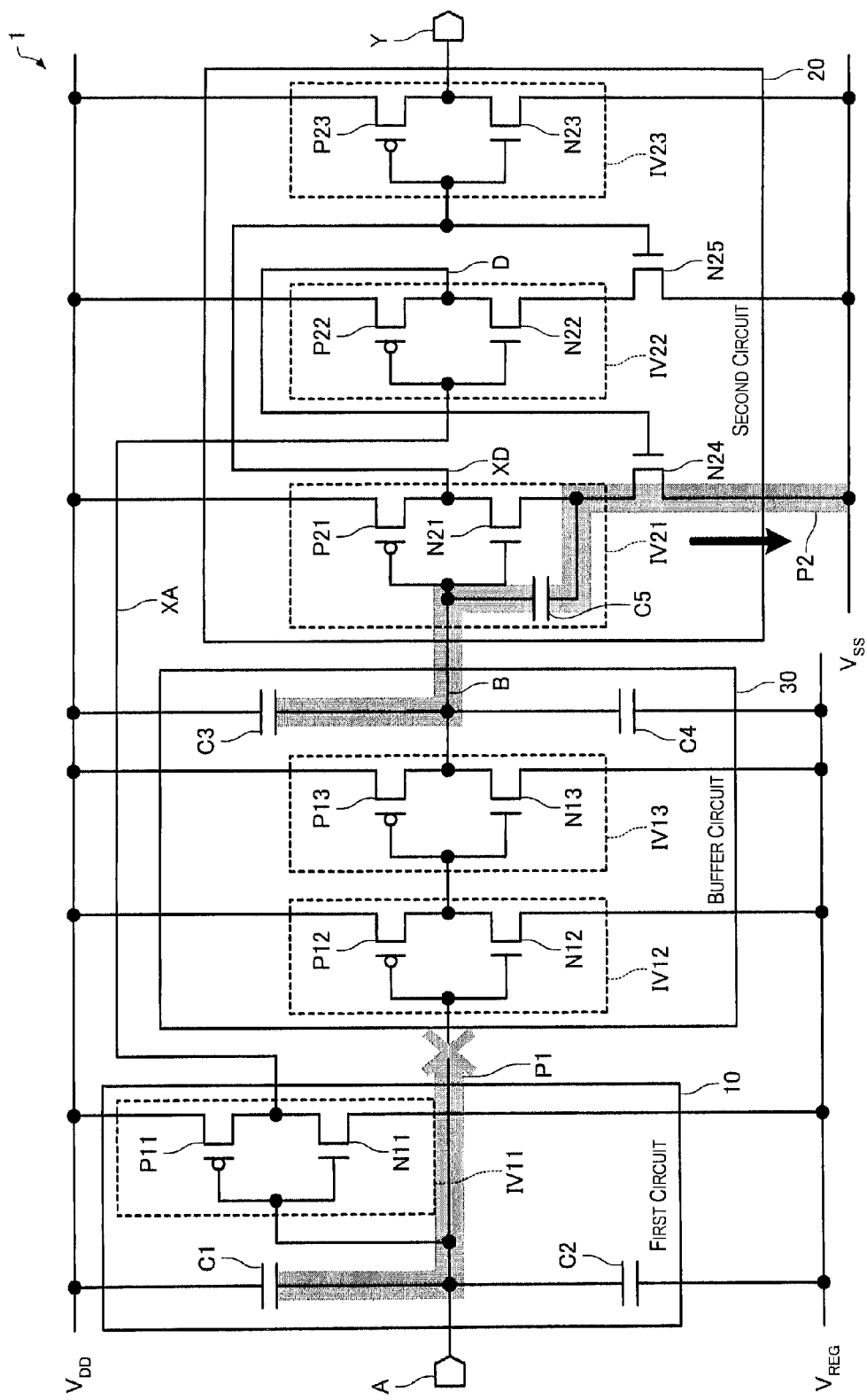
FIG. 2 is a diagram for illustrating blocking of the discharge path of the level shifter circuit of the first embodiment.
Figure 3A:
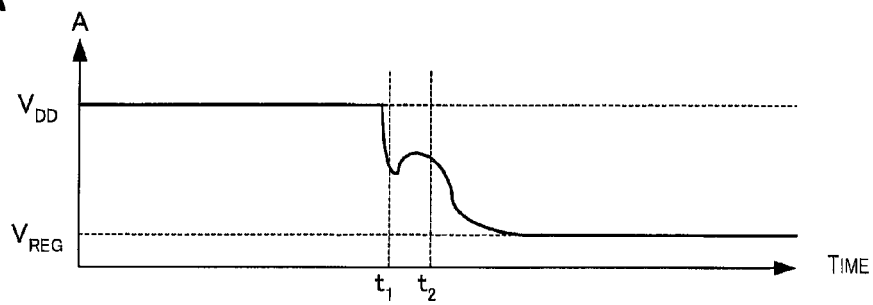
FIG. 3 A to FIG. 3 E are waveform diagrams for explaining the improvement in response speed of the level shifter circuit of the first embodiment.
Figure 3B:
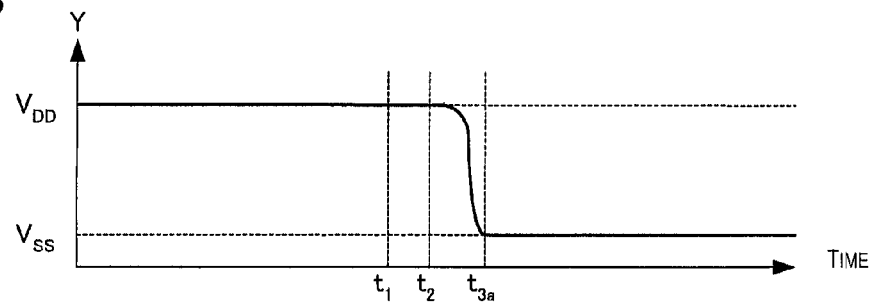
Figure 3C:
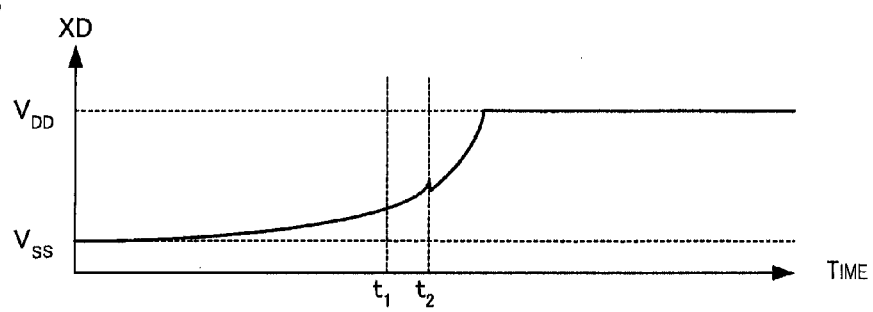
Figure 3D:
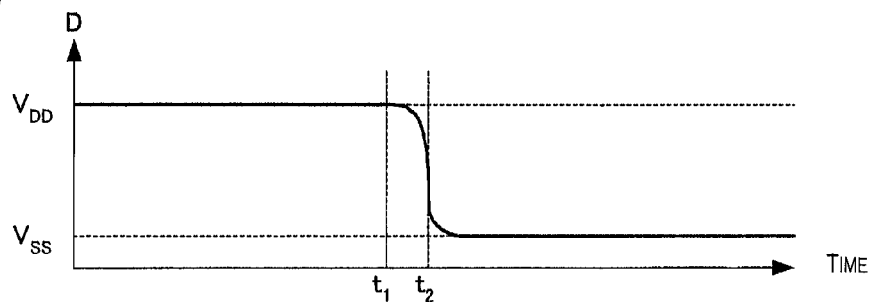
Figure 3E:
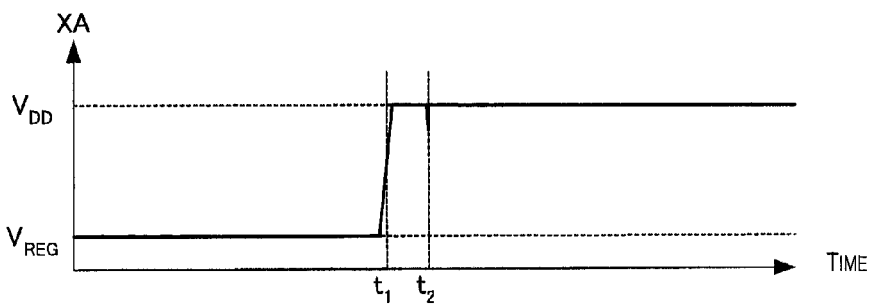

Following, by the level shifter circuit 1 including a buffer circuit 30, we will explain the reason it is possible to resolve the comparison example problems of the occurrence of spike noise and delay in the response speed. FIG. 2 is a circuit diagram showing the path of the charge that flows to the parasitic capacitance C5 of the level shifter circuit 1. The same code numbers are given to the same elements as FIG. 1, and we will omit an explanation of those.

With the level shifter circuit 1, in contrast to the comparator circuit 100 (see FIG. 8), the path from the parasitic capacitance C1 to the parasitic capacitance C5 is divided by the buffer circuit 30. In other words, as shown in FIG. 2, the path P1 that the comparator circuit 100 has (path from the parasitic capacitance C1 to the parasitic capacitance C5) is blocked by the buffer circuit 30 so does not exist in the level shifter circuit 1.

Here, the inverter IV12 is an inverter that operates with the first electric potential system, and its threshold value can be a potential midway between $V_{DD}$ and $V_{REG}$. In other words, since voltage conversion is not performed, the parasitic capacitance of the inverter IV12 is extremely small compared to that of the initial stage inverter (inverter IV21). Thus, even if a charge flows from the parasitic capacitance C1 to the parasitic capacitance (not illustrated) of the inverter IV12, there is no occurrence of the phenomenon of the input signal A being pulled back from low level to high level.

Meanwhile, with the initial stage inverter (inverter IV21), the path from the parasitic capacitance C1 is divided, but the parasitic capacitance C3 and the parasitic capacitance C5 of the buffer circuit 30 are directly connected by the signal line that transmits the second signal B. Thus, it is possible for the charge accumulated in the parasitic capacitance C3 to flow toward the parasitic capacitance C5. Then, when the initial stage switch is in an on state, the charge of the parasitic capacitance C5 flows to the power supply line (here, $V_{SS}$) (path P2 of FIG. 2).

However, by there being a buffer circuit 30, there is no direct effect on the input signal A by the discharge from the parasitic capacitance C3. Thus, the input signal A does not for example have occurrence of the phenomenon of being pulled back from low level to high level. As a result, the problem of high frequency spike noise riding on the output signal Y also does not occur. Also, the response speed until a stable output signal Y is generated after receiving the input signal A is faster than with the comparator circuit 100.

Here, as noted previously, the second circuit 20 with the level shifter circuit 1, in contrast to the comparator circuit 100, receives the second signal B rather than directly receiving the input signal A. Note that the input signal A and the second signal B are logically equivalent values. For that reason, there are many places for which signal changes and transistor on/off changes are common to the comparator circuit 100. For example, this is the same for the previously noted ST1 to ST5. However, with the parasitic capacitance C5, a phenomenon such as the input signal A being pulled back to high level (ST6 and thereafter) does not occur.

FIG. 3 A to FIG. 3 E are waveform diagrams of the signals of the level shifter circuit 1. The code numbers and times of FIG. 3 A to FIG. 3 E are the same as those in FIG. 11 A to FIG. 11 E. Note that the input signal A, the output signal Y, the third signal XD, the output signal (D) of the inverter IV22, and the first signal XA are signals of the same code numbers as those of the level shifter circuit 1 in FIG. 1.

The same as in FIG. 11 A to FIG. 11 E, the input signal A at time t1 changes from high level to low level, and the respective signals change as shown in FIG. 3 A to FIG. 3 E. Here, comparing FIG. 3 B and FIG. 11 B, at time t1, the level shifter circuit 1 does not have spike noise occur on the output signal Y. Also, at time t2, with the comparator circuit 100, the change occurs of the first signal XA being pulled back to low level (see FIG. 11 E). However, with the level shifter circuit 1, as shown in FIG. 3 E, the first signal XA is stable, staying at high level.

Then, again comparing FIG. 3 B and FIG. 11 B, with the level shifter circuit 1, we can see that the speed of the output signal Y becoming stable is faster. As shown in FIG. 11 B, with the comparator circuit 100, there is an effect of the charge from the parasitic capacitance C5 flowing out, so the input signal A wavers, and the output signal Y does not stabilize by time t3. Meanwhile, the input signal A does not fluctuate with the level shifter circuit 1, and as shown in FIG. 3 B, the output signal Y becomes stable at time t3a which is earlier than time t3.

As described above, the level shifter circuit 1 of this embodiment resolved the problems of the occurrence of spike noise and delay in the response speed that occurred with the comparator circuit 100 by including the buffer circuit 30. At this time, the buffer circuit 30 can for example be constituted with a two stage inverter as shown in FIG. 1, and the circuit scale does not markedly increase compared with the comparator circuit 100.

3. Second Embodiment

Figure 4:
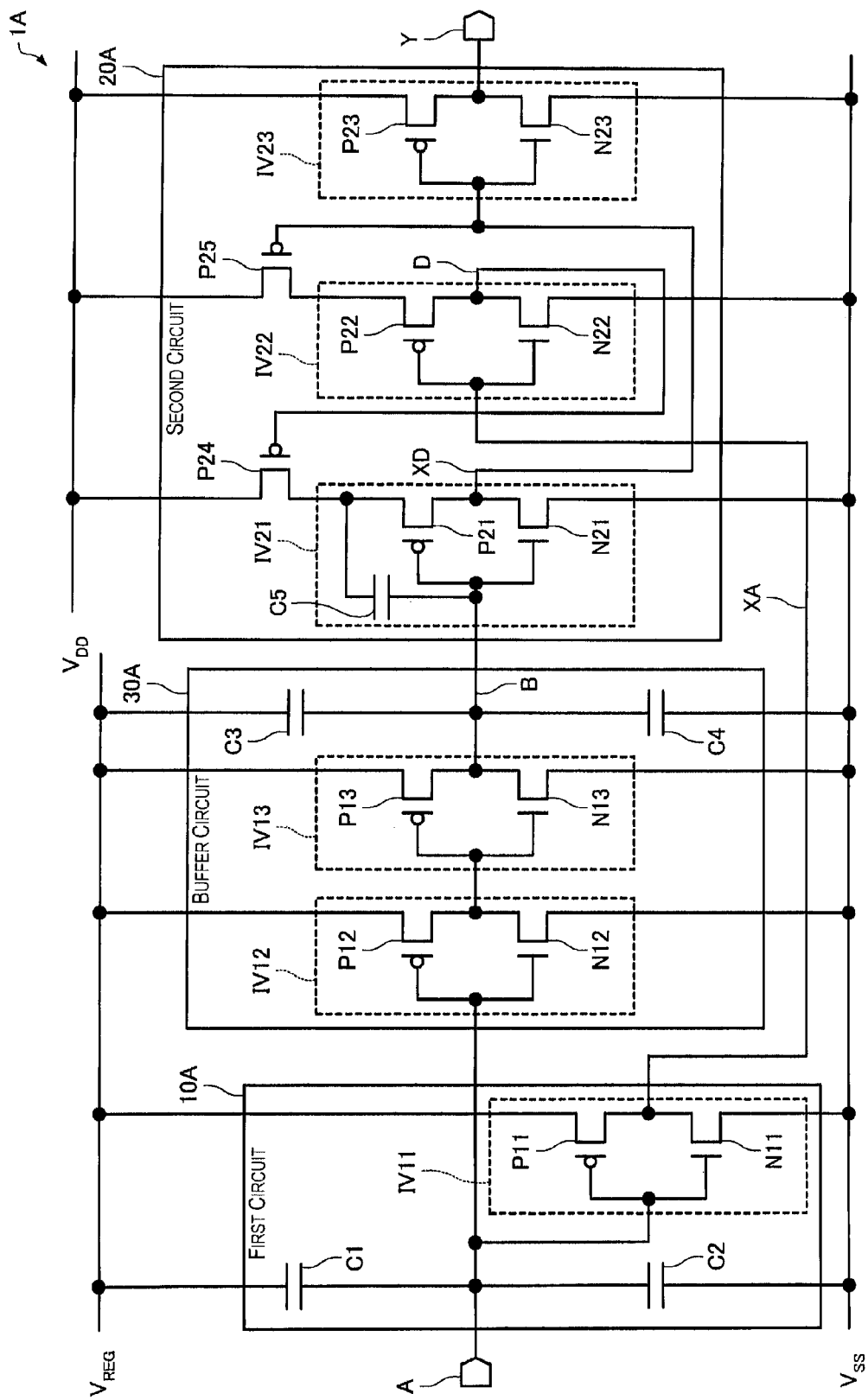
FIG. 4 is a circuit diagram of the level shifter circuit of the second embodiment.

FIG. 4 is a circuit diagram of the level shifter circuit 1A of this embodiment. The level shifter circuit 1A of this embodiment is constituted using a P type substrate in contrast to the level shifter circuit 1 of the first embodiment. Then, the lower power supply potential which is the reference potential is common to the first electric potential system and the second electric potential system (first low potential=second low potential=$V_{SS}$). The same code numbers are given to the same elements in FIG. 1 to FIG. 3 and FIG. 7 to FIG. 11 E, and an explanation will be omitted for already explained items. Note that $V_{SS}<V_{REG}<V_{DD}$.

The level shifter circuit 1A of this embodiment also transmits the first electric potential system signal to the second electric potential system which has a greater power supply potential difference than the first electric potential system. Here, the level shifter circuit 1A of this embodiment includes the first circuit 10A that uses the first electric potential system, the second circuit 20A that uses the second electric potential system, and the buffer circuit 30A.

The first circuit 10A, the same as the first circuit of the first embodiment, includes the inverter IV11. Also, the first circuit 10A includes parasitic capacitances C1 and C2 between the signal line that transmits the input signal A and the power supply. However, in contrast to the first embodiment, the parasitic capacitance C1 exists between [the signal line and] the power supply that supplies the potential $V_{REG}$, and the parasitic capacitance C2 exists between [the signal line and] the power supply that supplies the potential $V_{SS}$.

The buffer circuit 30A, the same as the buffer circuit 30 of the first embodiment, is constituted by two stage inverters IV12 and IV13 that operate with the first electric potential system. Also, the buffer circuit 30A includes parasitic capacitances C3 and C4 between the signal line that transmits the second signal B and the power supply. However, in contrast to the first embodiment, the parasitic capacitance C3 exists between [the signal line and] the power supply that supplies the potential $V_{REG}$, and the parasitic capacitance C4 exists between [the signal line and] the power supply that supplies the potential $V_{SS}$.

The second circuit 20A, the same as with the second circuit 20 of the first embodiment, receives the second signal B and the first signal XA, and generates the output signal Y which is the second electric potential system signal. The second circuit 20 includes three inverters IV21, IV22, and IV23. The same as with the first embodiment, the inverter IV21 is an initial stage inverter.

However, in contrast to the first embodiment, the initial stage inverter and the inverter IV22 are respectively connected via the P type transistor P24 and the P type transistor P25 to the power supply that supplies the second high potential (here, $V_{DD}$). Signals output respectively from the inverter IV22 and the initial stage inverter are connected to the P type transistor P24 and the P type transistor P25 gates.

At this time, the P type transistor P24 is an initial stage switch. Then, as shown in FIG. 4, parasitic capacitance C5 exists between the signal line that transmits the second signal B and the node that connects the initial stage inverter and the initial stage switch.

Even when using the P type substrate, by using a constitution like that of the level shifter circuit 1A of this embodiment, the same as in the case of the first embodiment, it is possible to resolve the problems with the comparator circuit 100 of spike noise riding on the output signal Y and the response speed of the output signal Y becoming slower.

Here, we will explain a case when the input signal A changes from low level to high level. With the level shifter circuit 1A, when the input signal A changes from low level to high level, the first signal XA which is the output of the inverter IV11 which operates with the first electric potential system changes to low level. Also, along with changes in the input signal A, the second signal B also changes from low level to high level. Having done that, when the N type transistor N21 is turned on, the third signal XD changes to low level.

Then, the output signal Y of the inverter IV23 goes to high level. Also, when the P type transistor P25 is turned on, the electric potential of that drain terminal is determined. Then, with the inverter IV22, when the P type transistor P22 is turned on, the N type transistor N22 turns off. As a result, the output signal (D) of the inverter IV22 goes to high level.

Then, when the initial stage switch (P type transistor P24) is turned off, the electric potential of the drain terminal is determined. At this time, there is a flow of a charge between the parasitic capacitance C5 and the parasitic capacitance C4, but the same as with the first embodiment, with the existence of the buffer circuit 30A, there is no occurrence of a phenomenon such as the input signal A being pulled back to low level.

Therefore, with the level shifter circuit 1A as well, it is possible to resolve the problems of the comparator circuit 100 of spike noise riding on the output signal Y, and the response speed of the output signal Y becoming slower. When the input signal A is low level, conversely from the first embodiment, the initial stage switch goes to an on state.

4. Modification Examples

Modification examples of the first embodiment and the second embodiment will be explained while referring to FIG. 5 and FIG. 6. The same code numbers are given to the same elements as in FIG. 1 to FIG. 4 and FIG. 7 to FIG. 11 E, and an explanation is omitted for already explained elements.

4.1. First Modification Example

Figure 5:
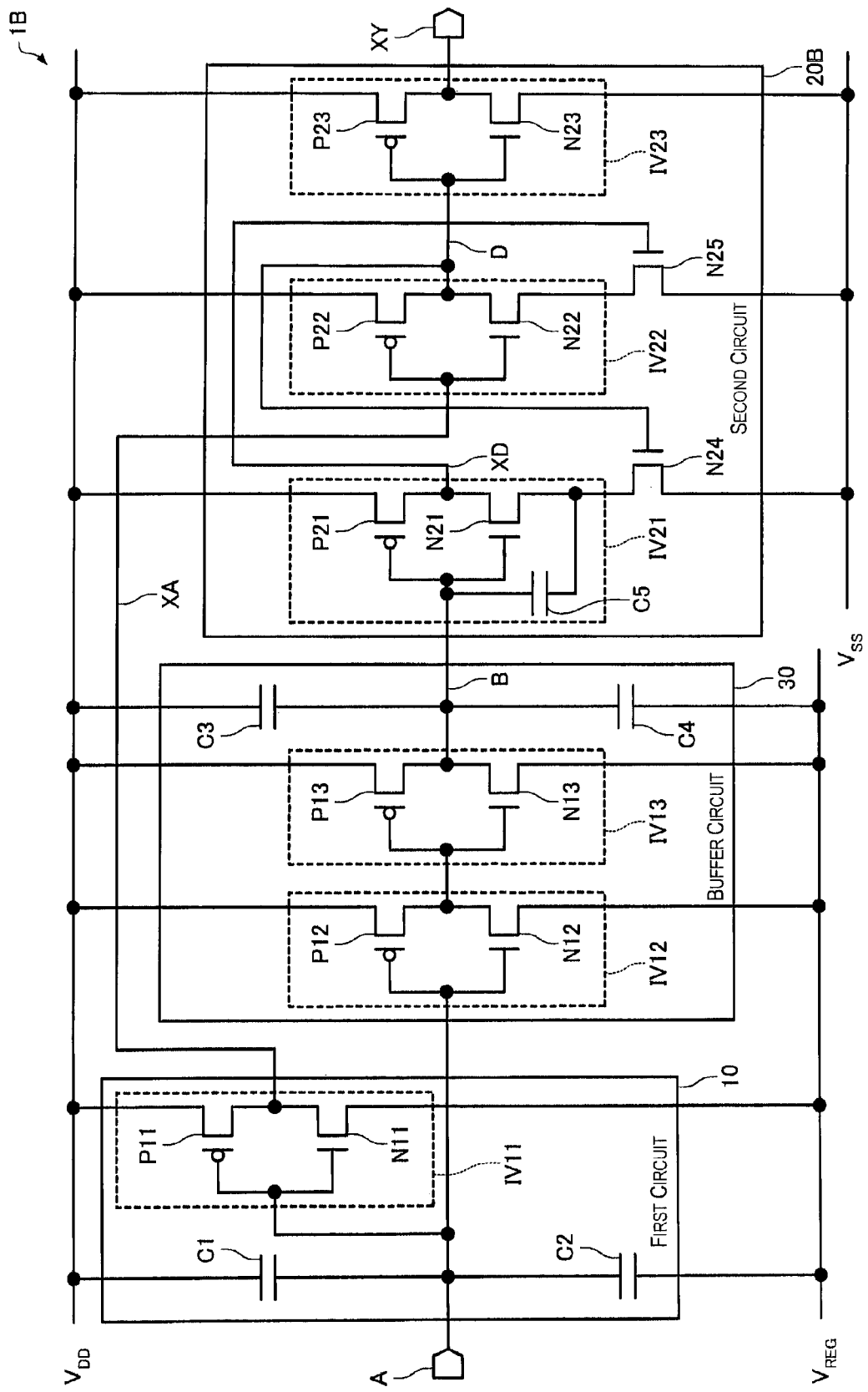
FIG. 5 is a circuit diagram of the level shifter circuit of the first modification example.

FIG. 5 is a circuit diagram of level shifter circuit 1B of the first modification example. Modification was performed on the output signal of the level shifter circuit 1B. The level shifter circuit 1B has a circuit diagram of the case of the N type substrate that is the same as that of the first embodiment, but a circuit can also be constituted using a P type substrate as with the second embodiment.

The level shifter circuit 1B, in contrast to the level shifter circuit 1 of the first embodiment, generates an output signal XY for which the logic of the input signal A is inverted. The level shifter circuit 1B is the same as the level shifter circuit 1 of the first embodiment in regards to the first circuit 10 and the buffer circuit 30, for example. However, the inverter IV23 of the second circuit 20B uses as the output signal XY an item for which the inverter IV22 output signal (D) is inverted rather than the third signal XD.

With the level shifter circuit 1B of the first modification example as well, the path from the parasitic capacitance C1 to the parasitic capacitance C5 is divided by the buffer circuit 30. Also, the path from the parasitic capacitance C1 to the parasitic capacitance (not illustrated) of the N type transistor N22 is blocked by the inverter IV11. Thus, the problems with the comparator circuit 100 of the occurrence of spike noise and the delay in response speed are resolved.

The electric potential of the node that connects the inverter IV22 and the N type transistor N25 is determined by the third signal XD. Specifically, with the level shifter circuit 1B as well, the output signal XY (inverted inverter IV22 output signal) is generated based on the third signal XD.

4.2. Second Modification Example

Figure 6:
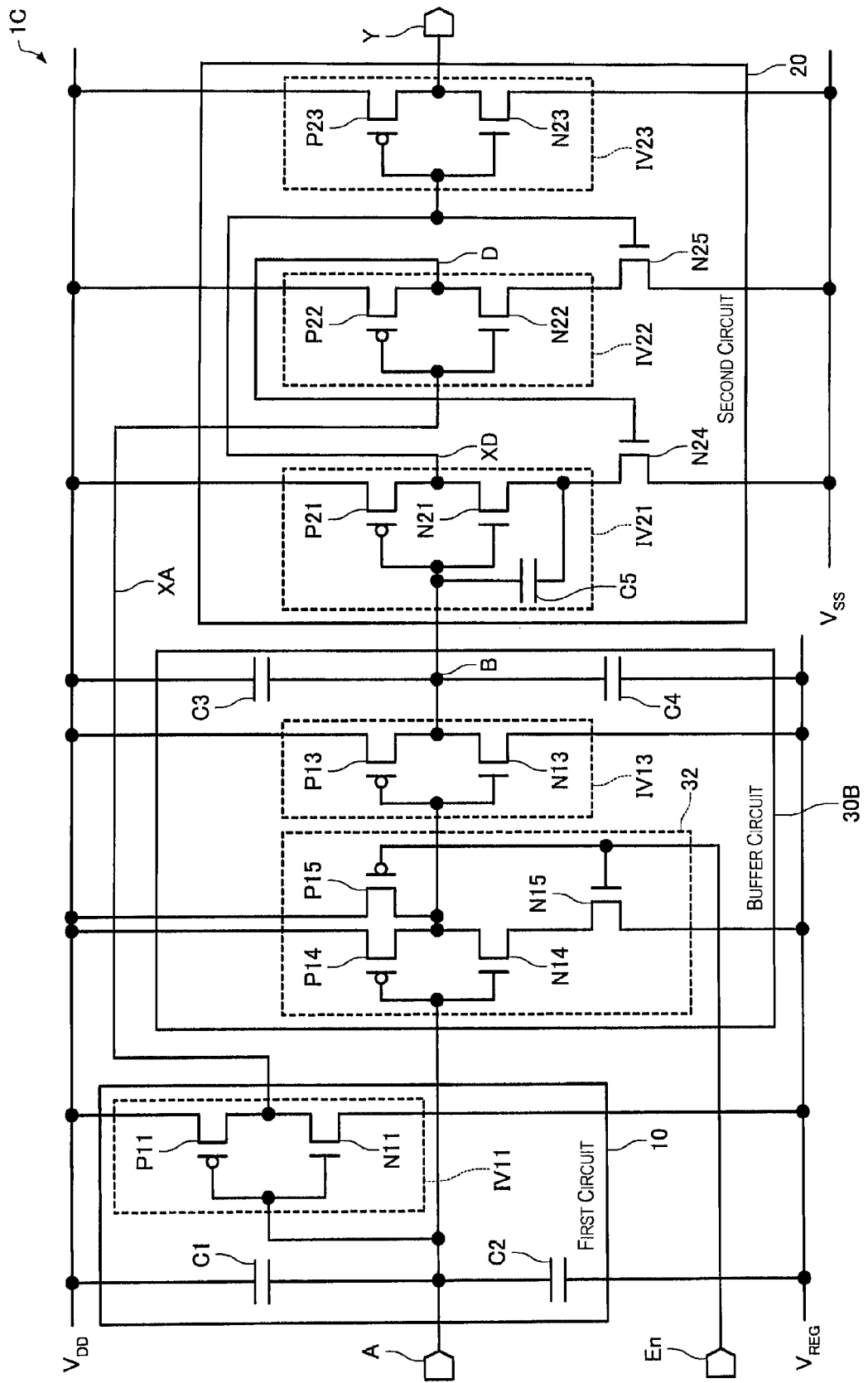
FIG. 6 is a circuit diagram of the level shifter circuit of the second modification example.

FIG. 6 is a circuit diagram of the level shifter circuit 1C of the second modification example. The level shifter circuit 1C has a modification performed on the buffer circuit configuration. The level shifter circuit 1C has the circuit diagram of the case when using the N type substrate, the same as with the first embodiment, but it is also possible to constitute the circuit using a P type substrate as with the second embodiment.

The level shifter circuit 1C, in contrast to the level shifter circuit 1 of the first embodiment, is equipped with an enable signal En for which normal operation as a level shifter is executed. With the example of the circuit diagram of FIG. 6, when the enable signal En is high level, the level shifter circuit 1C performs normal operation, and when the enable signal En is low level, the output signal Y is fixed at low level. For example, when not using the level shifter circuit 1C, the output signal Y is fixed, and this can be used for applications for reducing power consumption.

The level shifter circuit 1C, for example with the first circuit 10 and the second circuit 20, is the same as the level shifter circuit 1 of the first embodiment. However, the buffer circuit 30B is not an item for which an even number stage inverter is connected. The buffer circuit 30B, for example, instead of the inverter IV12 of the first embodiment, includes a NAND circuit 32 that receives the input signal A and the enable signal En. At this time, during normal operation, the NAND circuit 32 functions as an inverter, and the input signal A second signal B are logically equivalent values.

In this way, the buffer circuit is not limited to a configuration connecting an even number stage inverter, but can have any circuit configuration provided that during normal operation, the input signal A and the second signal B are logically equivalent values.

For the level shifter circuit 1C of the second modification example as well, the path from the parasitic capacitance C1 to the parasitic capacitance C5 is divided by the buffer circuit 30. Thus, the problems with the comparator circuit 100 of the occurrence of spike noise and the delay in response speed are resolved.

5. Application Example 5.1. Integrated Circuit Device

Application of the aforementioned level shifter circuit to an integrated circuit (IC) device will be explained while referring to FIG. 12 A to FIG. 15. The same code numbers are given to the same elements as in FIG. 1 to FIG. 11 E, and an explanation is omitted for already explained elements.

Figure 12A:
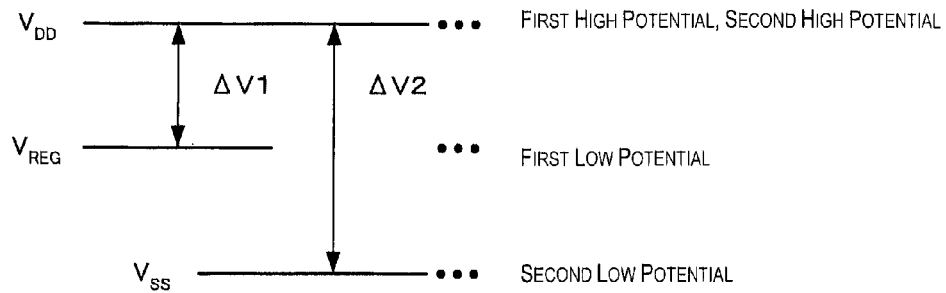
FIG. 12 A to FIG. 12 C are diagrams for explaining the relationship between the first electric potential system and the second electric potential system.
Figure 12B:
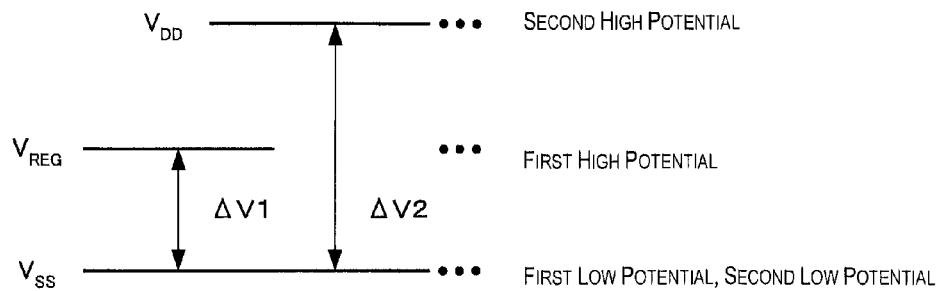
Figure 12C:
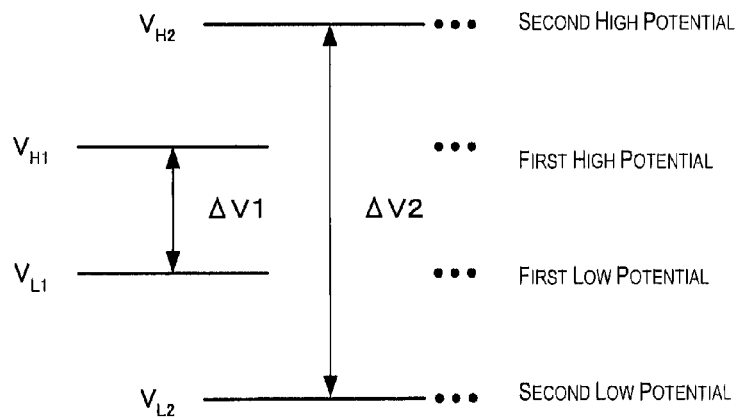

FIG. 12 A to FIG. 12 C are diagrams for explaining the relationship between the first electric potential system and the second electric potential system. The first electric potential system power supply potential difference is $\Delta V1$, and the second electric potential system power supply potential difference is $\Delta V2$. Then, $\Delta V1 < \Delta V2$ is established.

For example, with the level shifter circuits of the first embodiment, first modification example, and second modification example, the first electric potential system uses as the power supply potential the first high potential ($V_{DD}$) and the first low potential ($V_{REG}$), and the second electric potential system uses as the power supply potential the second high potential ($V_{DD}$) and the second low potential ($V_{SS}$). Then, as shown in FIG. 12 A, the higher power supply potential which is the reference potential is common to the first electric potential system and the second electric potential system (first high potential=second high potential=$V_{DD}$).

Also, for example, with the level shifter circuit of the second embodiment, the first electric potential system uses as the power supply potential the first high potential ($V_{REG}$) and the first low potential ($V_{SS}$), and the second electric potential system uses as the power supply potential the second high potential ($V_{DD}$) and the second low potential ($V_{SS}$). Then, as shown in FIG. 12 B, the lower power supply potential which is the reference potential is common to the first electric potential system and the second electric potential system (first low potential=second low potential=$V_{SS}$).

Here, there was a common power supply potential with the aforementioned level shifter circuit, but provided the relationship between the first electric potential system and the second electric potential system is as shown in FIG. 12 C, it is also acceptable that the power supply potential not be common. In other words, the range of available first electric potential system signals ($V_{L1}$ to $V_{H1}$) is acceptable provided it is included in the range of available second electric potential system signals ($V_{L2}$ to $V_{H2}$).

Here, as an example of a case when circuits that operate with the first electric potential system and circuits that operate with the second electric potential system exist mixed together, it is possible to use circuits manufactured using different semiconductor processes connected on a board substrate or within an IC chip. For example, these are cases such as of circuits for which there is a large difference in process generations and the transistor gate lengths are markedly different, or when one is a bulk type MOS integrated circuit and the other is an SOI type MOS integrated circuit and these are both connected.

Figure 13:
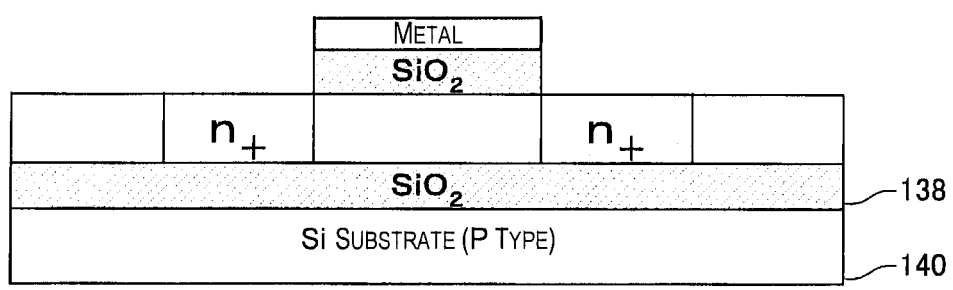
FIG. 13 is a cross section diagram of an SOI type MOS transistor.

FIG. 13 is a cross section diagram of an SOI type MOS integrated circuit (here, N type transistor). On a substrate (P type substrate 140), an insulating film 138 such as $SiO_2$, for example, is formed, and transistors are created on top of that. At this time, it is possible to reduce the stray capacitance between the parasitic diode and the substrate, so it is possible to operate using a lower power supply potential than with the bulk type MOS integrated circuit, and thus to lower the power consumption of the circuit. However, when SOI type MOS integrated circuits and bulk type MOS integrated circuits are mixed, a power supply for SOI type MOS integrated circuits (first electric potential system) and a power supply for bulk type MOS integrated circuits (second electric potential system) are required, and a level shifter circuit is required between these.

Figure 14A:
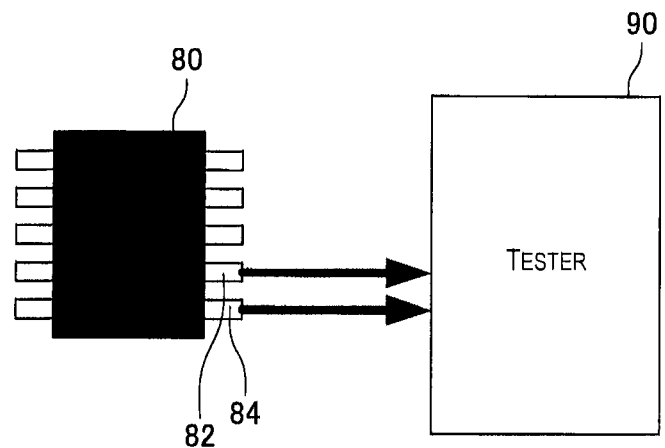
FIG. 14 A to FIG. 14 B are diagrams for illustrating an integrated circuit device containing a level shifter circuit.
Figure 14B:
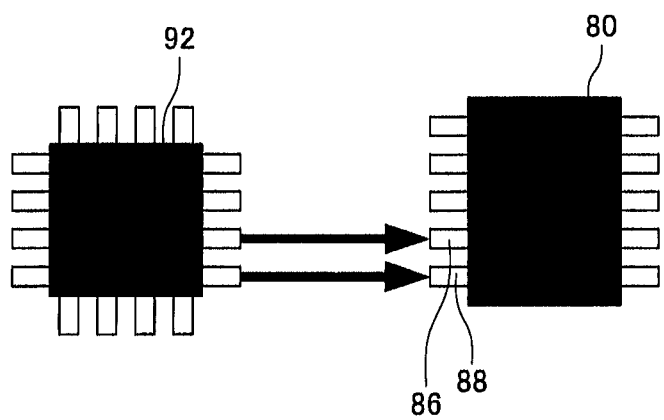

FIG. 14 A is a diagram illustrating a case of testing the integrated circuit device 80 constituted with SOI type MOS integrated circuits using a well-known bulk type MOS integrated circuit tester 90. At this time, it is necessary to output the second electric potential system signals from the output terminals 82 and 84. Meanwhile, for lower power consumption, the first electric potential system signals are used within the integrated circuit device 80.

In such a case, the aforementioned level shifter circuit can be applied to the output buffer of the integrated circuit device 80 output terminals 82 and 84. At this time, it is possible to output from the output terminals 82 and 84 signals which have no spike noise and for which the response speed is fast. Also, being able to use the bulk type MOS integrated circuit tester 90 is also linked to reducing manufacturing costs of the integrated circuit device 80. Instead of the tester 90, it is also possible to connect with another integrated circuit device constituted with a bulk type integrated circuit.

FIG. 14 B is a diagram illustrating a case of for example, the integrated circuit device 80 on a substrate receiving first electric potential system signals from the integrated circuit device 92. At this time, the integrated circuit device 80 is equipped with both first electric potential system and second electric potential system power supplies.

In such a case, it is possible to apply the aforementioned level shifter circuit to the input buffer of the integrated circuit device 80 input terminals 86 and 88. At this time, the integrated circuit device 80 does voltage conversion of the signals received by the input terminals 86 and 88, but since there is no riding of spike noise, there is no occurrence of communication errors. Also, since the response speed is fast, it is possible to increase the overall system processing capability including the integrated circuit device 92 and the integrated circuit device 80.

The level shifter circuit with the integrated circuit device 80 is not limited to being applied as an input buffer or output buffer. FIG. 15 is a diagram illustrating a part of a circuit of the integrated circuit device 80 including the level shifter circuit 1. With the example in FIG. 15, clock signals of different frequencies are used with the first electric potential system and the second electric potential system. At this time, the level shifter circuit 1 is provided, and the second electric potential system clock signal 97 is generated based on the original clock signal 95 from the oscillation circuit 94.

For example, it is possible to provide a level shifter circuit 1 for each respective data signal that performs voltage conversion, but the layout surface area of the integrated circuit device 80 could increase markedly. When the layout surface area is limited, as shown in FIG. 15, it is possible to inhibit the increase in surface area by installing a level shifter circuit 1 for the high speed clock which occupies a great deal of the current consumption.

Figure 15:
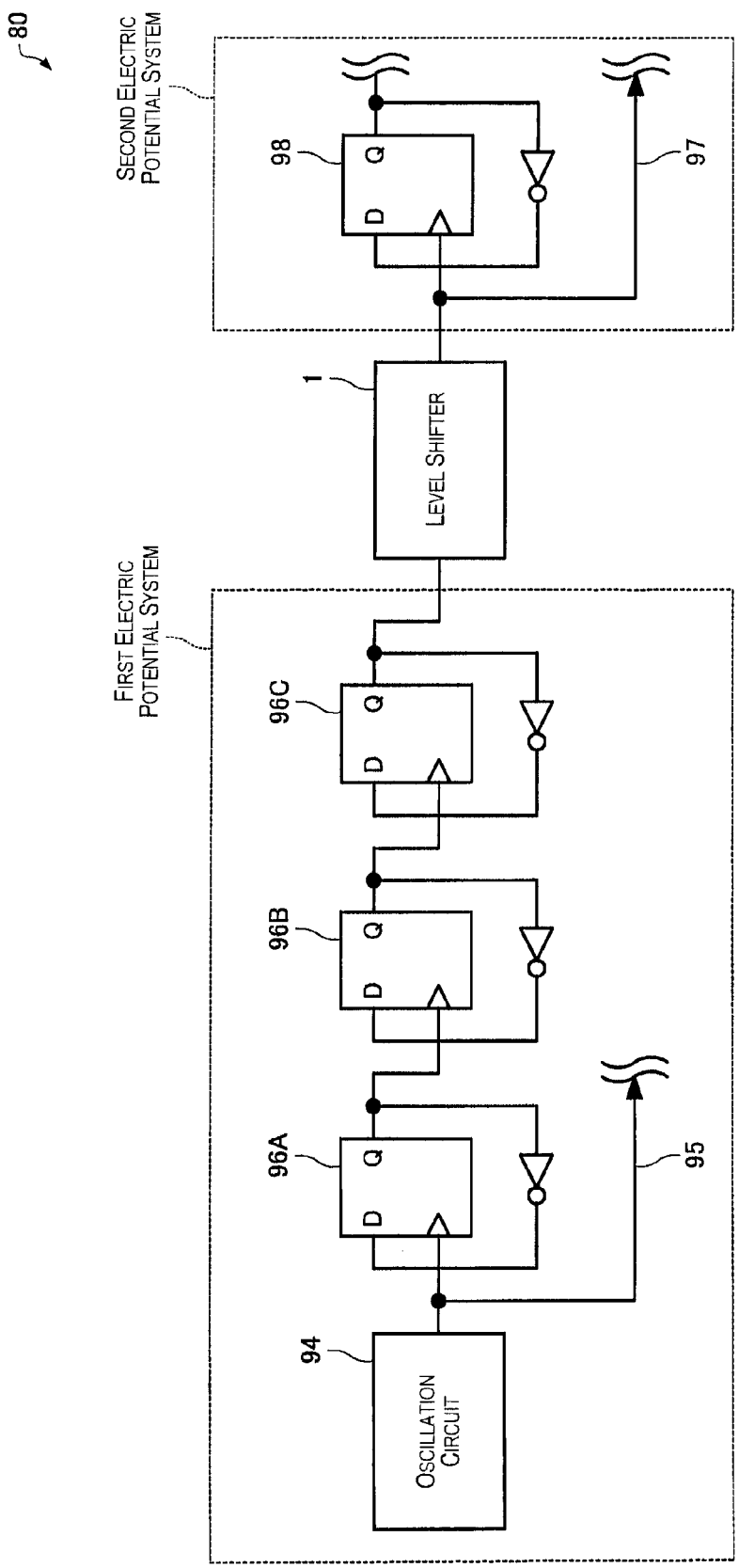
FIG. 15 is a diagram for illustrating another example of an integrated circuit device containing a level shifter circuit.

The integrated circuit device 80 in FIG. 15 includes an oscillation circuit 94, a ripple counter (constituted by flip-flops 96A, 96B, and 96C) which does frequency division of the original clock signal 95 from the oscillation circuit 94. and a level shifter circuit 1 which operate with the first electric potential system, and a circuit which operates with the second electric potential system (here, flip-flop 98). The clock signal 97 of the second electric potential system has a lower frequency than that of the original clock signal 95.

At this time, only the original clock signal 95 which is a high speed clock signal is driven by the first electric potential system, and the lower speed clock signal 97 is driven by the second electric potential system. For example, it is also possible to install level shifter circuits 1 for all the output terminals (see output terminals 82 and 84 in FIG. 14 A). Then, since it is acceptable to use the level shifter circuit 1 only for transfer of the click signal 97 from the original clock signal 95, it is possible to make the layout surface area smaller, and also to lower the costs. Also, since it is possible to make lower voltage for the high speed clock part, there is also a current consumption lowering effect.

This level shifter has no riding of spike noise and has fast response speed, so it is preferably used for a very important location in terms of operation such as clock transfer. At this time, the effects noted above can be obtained while suppressing to a minimum an increase in the surface area. Note that with the first electric potential system, it is possible to use not only the original clock signal 95, but also the output of the flip-flops 96A to 96C as clock signals. Also, with the second electric potential system, it is possible to use not only the original clock signal 97, but also the output of the flip-flop 98 as clock signals. Then, the frequency division circuit can also have a constitution other than a ripple counter.

5.2. Electronic Equipment

Figure 16A:
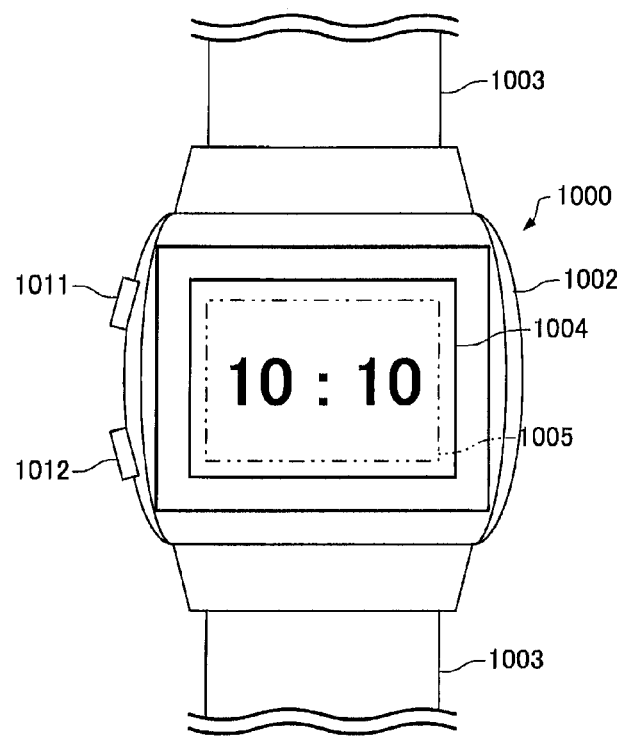
FIG. 16 A is a diagram of an electronic watch which is an example of electronic equipment, and FIG. 16 B is a diagram of electronic paper as an example of electronic equipment.
Figure 16B:
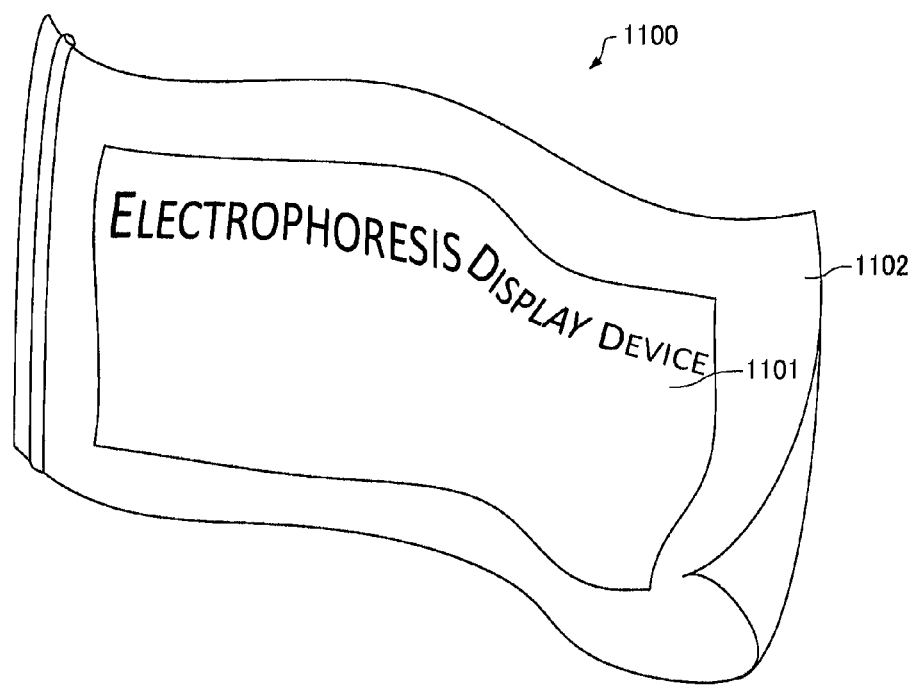

The aforementioned level shifter circuit or an integrated circuit device that includes that can be applied to various types of electronic equipment. FIG. 16 A to FIG. 16 B are diagrams illustrating specific examples of electronic equipment.

FIG. 16 A is a front view of an electronic watch 1000 which is one example of electronic equipment. The electronic watch 1000 is for example a wristwatch, and is equipped with a watch case 1002, and a pair of bands 1003 connected to the watch case 1002. A display unit 1004 is provided on the front surface of the watch case 1002 to perform time display 1005. Two operating buttons 1011 and 1012 are provided on the side surface of the watch case.

For example, within the electronic watch 1000, there are cases of constituting the high use frequency circuits used for time display using an SOI type MOS integrated circuit to suppress power consumption. Meanwhile, the interface circuit that receives instructions by the user operating buttons 1011 and 1012 has low usage frequency, so there are cases when it is realized using a bulk type MOS integrated circuit. At such a time, input and output of signals between MOS integrated circuits for which these electric potential systems are different can also be performed by the aforementioned level shifter circuit.

Also, for example, FIG. 16 B is a perspective view of electronic paper 1100 which is one type of electronic equipment. The electronic paper 1100 has flexibility, and is equipped with a display area 1101 and a main unit 1102. For example, in a case such as when the manufacturing process is different for the integrated circuit device for display on the display area 1101 and the integrated circuit device for the user interface of the main unit 1102, the aforementioned level shifter circuit can be used for example as an input/output buffer.

6. Other

The invention is not limited to these examples, and also includes constitutions that are substantially the same as the constitutions explained with these embodiments (e.g. constitutions with the same function, method, and effect, or constitutions with the same purpose and effect). Also, the invention includes constitutions for which non-essential parts of the constitution explained with the embodiments are replaced. Also, the invention includes constitutions exhibiting the same operational effects as the constitutions explained with the embodiments, or constitutions that are able to achieve the same objectives. The invention includes constitutions for which publicly known technology is added to the constitutions explained with the embodiments.

What is claimed is:

1. A level shifter circuit for transmitting a signal of a first electric potential system to a second electric potential system for which the power supply potential difference is larger than the first electric potential system, comprising:

a first circuit for receiving an input signal of the first electric potential system which uses a first high potential which is on the high potential side and a first low potential which is on the low potential side as the power supply electric potential, and outputs a first signal which is a signal of the first electric potential system, the first circuit operating with the first electric potential system;

a second circuit which generates an output signal, according to the input signal, of the second electric potential system which uses as the power supply electric potential a second high potential which is on the high potential side and a second low potential which is on the low potential side, the second circuit operating with the second electric potential system; and a buffer circuit which receives the input signal and outputs a logically equivalent second signal to the input signal, the second signal being a signal of the first electric potential system, the buffer circuit operating with the first electric potential system, the second circuit including an initial stage inverter which is an inverter circuit that receives the second signal and outputs a third signal, and an initial stage switch that switches between connecting and disconnecting the initial stage inverter and a power supply that supplies the second high potential or a power supply that supplies the second low potential, based on the first signal, and generates the output signal based on the third signal.

2. The level shifter circuit according to claim 1, wherein the second circuit uses signals for which the third signal has been inverted as the output signal.

3. The level shifter circuit according to claim 1, wherein the same electric potential is used for the first high potential and the second high potential.

4. The level shifter circuit according to claim 3, wherein the second circuit
has the initial stage inverter disconnected from the power supply that supplies the second low potential using the initial stage switch when the input signal is low level, and
has the initial stage inverter connected to the power supply that supplies the second low potential by the initial stage switch when the input signal is high level.

5. The level shifter circuit according to claim 1, wherein the same electric potential is used for the first low potential and the second low potential.

6. The level shifter circuit according to claim 5, wherein the second circuit
has the initial stage inverter disconnected from the power supply that supplies the second high potential using the initial stage switch when the input signal is high level, and
has the initial stage inverter connected to the power supply that supplies the second high potential using the initial stage switch when the input signal is low level.

7. The level shifter circuit according to claim 1, wherein the buffer circuit is constituted with an even number stage inverter.

8. An integrated circuit device comprising the level shifter circuit according to claim 1.

9. An electronic watch comprising the level shifter circuit according to claim 8.

* * * * *